(12) United States Patent
Chang et al.

(10) Patent No.: US 11,784,635 B1
(45) Date of Patent: Oct. 10, 2023

(54) CONTROL CIRCUIT AND OPERATION SYSTEM

(71) Applicant: Nuvoton Technology Corporation, Hsinchu (TW)

(72) Inventors: Hen-Kai Chang, Hsinchu (TW); Chi-Ray Huang, Kaohsiung (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 17/893,903

(22) Filed: Aug. 23, 2022

(51) Int. Cl.
*H03K 3/037* (2006.01)
*H03K 19/21* (2006.01)
*H03K 5/01* (2006.01)
*H03K 5/00* (2006.01)

(52) U.S. Cl.
CPC ............. *H03K 3/037* (2013.01); *H03K 5/01* (2013.01); *H03K 19/21* (2013.01); *H03K 2005/00078* (2013.01)

(58) Field of Classification Search
CPC .......... H03K 3/037; H03K 5/01; H03K 19/21; H03K 2005/00078
USPC ....................................................... 327/225
See application file for complete search history.

(56) References Cited

U.S. PATENT DOCUMENTS

| | | | | |
|---|---|---|---|---|
| 5,794,022 A * | 8/1998 | Karouji | ............ | G06F 1/24 713/601 |
| 9,411,394 B2 * | 8/2016 | Younger | ............ | G06F 1/3287 |
| 9,696,788 B2 * | 7/2017 | Kabasawa | ............ | G06F 3/038 |
| 10,018,685 B2 * | 7/2018 | Kauter | ............ | G01R 33/07 |
| 11,313,909 B2 * | 4/2022 | Williamson | ............ | H03K 5/24 |
| 11,486,913 B2 * | 11/2022 | Nam | ............ | G06F 11/3041 |
| 2007/0024331 A1 | 2/2007 | Lin | | |
| 2019/0341803 A1 * | 11/2019 | Cook | ............ | H03K 3/037 |
| 2021/0294365 A1 * | 9/2021 | Yoo | ............ | G05F 1/565 |
| 2021/0357015 A1 * | 11/2021 | Mangano | ............ | G06F 1/325 |
| 2022/0103008 A1 * | 3/2022 | Torres Carino | ...... | G07C 5/0808 |
| 2022/0130432 A1 * | 4/2022 | Jayapal | ............ | H03K 5/01 |
| 2022/0404895 A1 * | 12/2022 | Naito | ............ | H01L 27/04 |

FOREIGN PATENT DOCUMENTS

| | | |
|---|---|---|
| CN | 103259525 A | 8/2013 |
| CN | 104539272 A | 4/2015 |
| TW | I528156 B | 4/2016 |

* cited by examiner

*Primary Examiner* — Ryan Jager
(74) *Attorney, Agent, or Firm* — Muncy, Geissler, Olds & Lowe, P.C.

(57) ABSTRACT

A control circuit including a timer circuit and a voltage monitor circuit is provided. The timer circuit enables a trigger signal every a fixed time interval in response to a wake-up event. The voltage monitor circuit is configured to determine whether the operation voltage reaches the expected voltage and includes a signal-generating circuit, a first delay circuit, a second delay circuit, and a determination circuit. The signal-generating circuit generates a reference signal according to the trigger signal. The first delay circuit receives the operation voltage and delays the reference signal to generate a first delay signal. The second delay circuit delays the trigger signal to generate a second delay signal. The determination circuit enables a wake-up signal according to the reference signal, the first delay signal, and the second delay signal in response to the wake-up event.

19 Claims, 6 Drawing Sheets

US 11,784,635 B1

CONTROL CIRCUIT AND OPERATION SYSTEM

BACKGROUND OF THE INVENTION

Field of the Invention

The invention relates to a control circuit, and more particularly to a control circuit that determines whether the operation voltage reaches the expected voltage.

Description of the Related Art

With technological development, the types and functions of electrical devices have increased. Each of the electrical devices comprises many electronic elements. To reduce the power consumption of electrical elements, an electronic element enters a power-down mode when it has not been used for a long time. In the power-down mode, the operation voltage of the electronic element may be equal to a standby voltage, such as 0V. When a wake-up event happens, the operation voltage gradually increases from the standby voltage. The electronic element may malfunction if it operates at the operation voltage before the operation voltage reaches a stable voltage. Additionally, when many operation voltages are increased simultaneously, the inrush of current may damage the electronic elements.

BRIEF SUMMARY OF THE INVENTION

In accordance with an embodiment of the disclosure, a control circuit comprises a timer circuit and a voltage monitor circuit. The timer circuit enables a trigger signal every a fixed time interval in response to a wake-up event. The voltage monitor circuit is configured to determine whether the operation voltage reaches the expected voltage and comprises a signal-generating circuit, a first delay circuit, a second delay circuit, and a determination circuit. The signal-generating circuit generates a reference signal according to the trigger signal. The first delay circuit receives the operation voltage and delays the reference signal to generate a first delay signal. The second delay circuit delays the trigger signal to generate a second delay signal. The determination circuit enables a wake-up signal according to the reference signal, the first delay signal, and the second delay signal in response to the wake-up event.

An exemplary embodiment of an operating system comprises a micro-controller circuit and a control circuit. The micro-controller circuit receives the operation voltage. In response to the operation being less than the expected voltage, the micro-controller circuit enters a sleep mode. In response to a wake-up signal being enabled, the micro-controller circuit exits the sleep mode and enters a normal mode. In the normal mode, the micro-controller circuit operates according to the operation voltage. The control circuit determines whether the operation voltage reaches the expected voltage in response to a wake-up event. In response to the operation voltage reaching the expected voltage, the control circuit enables the wake-up signal. The control circuit comprises a timer circuit and a voltage monitor circuit. The timer circuit enables a trigger signal every a fixed time interval in response to the wake-up event. The voltage monitor circuit is configured to determine whether the operation voltage reaches the expected voltage. In response to the operation voltage reaching the expected voltage, the voltage monitor circuit enables the wake-up signal.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
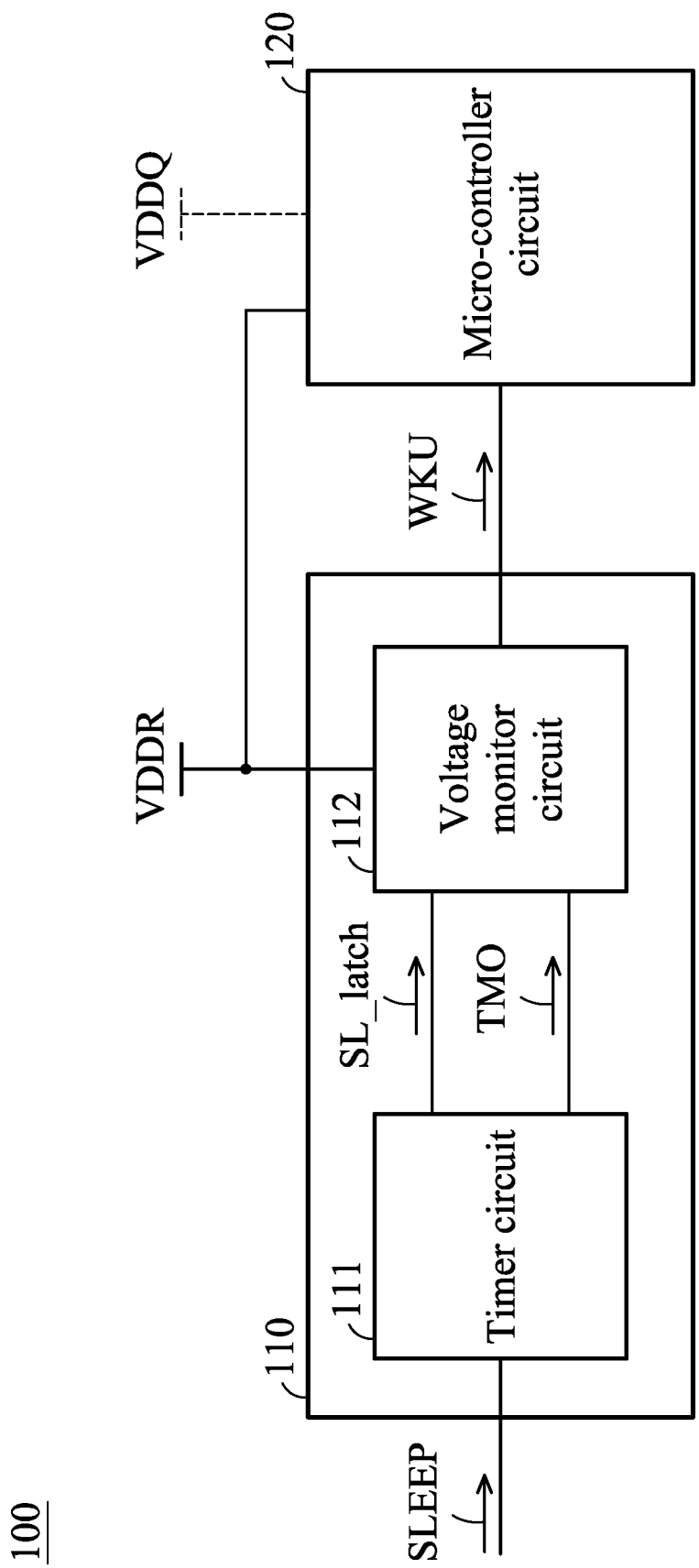
FIG. 1 is a schematic diagram of an exemplary embodiment of an operating system according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operating system according to various aspects of the present disclosure. The operating system 100 comprises a control circuit 110 and a micro-controller circuit 120. The control circuit 110 determines whether a wake-up event occurs. In this embodiment, the control circuit 110 determines whether a wake-up event happens according to the level of an external signal SLEEP. For example, when the level of the external signal SLEEP is not equal to a specific level (e.g., a low level), it is determined that the wake-up event has not occurred. Therefore, the control circuit 110 does not enable a wake-up signal WKU. At this time, the wake-up signal WKU may be at a first level, such as a high level. When the level of the external signal SLEEP is equal to the specific level, it is determined that a wake-up event has occurred. Therefore, the control circuit 110 determines whether the operation voltage VDDR reaches a first expected voltage. When the operation voltage VDDR reaches the first expected voltage, the control circuit 110 enables the wake-up signal WKU. At this time, the wake-up signal WKU may be at a second level, such as a low level.

In this embodiment, the control circuit 110 comprises a timer circuit 111 and a voltage monitor circuit 112. The timer circuit 111 is configured to determine whether a wake-up event exists. When a wake-up event exists, the timer circuit 111 enables a trigger signal TMO every a fixed time interval (e.g., 1 sec). When no a wake-up event exists, the timer circuit 111 does not enable the trigger signal TMO. The voltage monitor circuit 112 is configured to detect whether the operation voltage VDDR reaches a first expected voltage. When the trigger signal TMO is enabled, the voltage monitor circuit 112 detects whether the operation voltage VDDR reaches a first expected voltage. When the operation voltage VDDR reaches the first expected voltage, the voltage monitor circuit 112 enables the wake-up signal WKU. When the operation voltage VDDR does not reach the first expected voltage, the voltage monitor circuit 112 does not enable the wake-up signal WKU.

In another embodiment, the timer circuit 111 further delays the external signal SLEEP to generate a delay signal SL_latch. In this case, the voltage monitor circuit 112 determines whether to enable the wake-up signal WKU according to the operation voltage VDDR and the delay signal SL_latch. For example, when the operation voltage VDDR reaches the first expected voltage, if the level of the delay signal SL_latch is not equal to a specific level (e.g., a low level), the voltage monitor circuit 112 does not enable the wake-up signal WKU. Additionally, when the level of the delay signal SL_latch is equal to the specific level, if the operation voltage VDDR does not reach the first expected voltage, the voltage monitor circuit 112 does not enable the wake-up signal WKU. In this case, when the level of the delay signal SL_latch is equal to the specific level and the operation voltage VDDR reaches the first expected voltage, the voltage monitor circuit 112 enables the wake-up signal WKU.

In other embodiments, no matter whether the wake-up event happens, the timer circuit 111 enables the trigger signal TMO every a fixed time interval (e.g., 1 sec). In such cases, the voltage monitor circuit 112 detects whether the wake-up event happens and the operation voltage VDDR reaches a first expected voltage. In one embodiment, the voltage monitor circuit 112 utilizes the level of the external signal SLEEP to determine whether the wake-up event happens. Furthermore, the voltage monitor circuit 112 compares the operation voltage VDDR and a first expected voltage to determine whether the operation voltage VDDR reaches the first expected voltage. For example, when the trigger signal TMO is enabled, the voltage monitor circuit 112 determines whether the operation voltage VDDR reaches the first expected voltage. When the operation voltage VDDR reaches the first expected voltage, the voltage monitor circuit 112 determines whether the level of the external signal SLEEP is equal to a specific level. When the level of the external signal SLEEP is equal to the specific level, the voltage monitor circuit 112 enables the wake-up signal WKU. However, when the operation voltage VDDR does not reach the first expected voltage or the level of the external signal SLEEP is not equal to the specific level, the voltage monitor circuit 112 does not enable the wake-up signal WKU.

The disclosure does not limit the sequence of detecting the level of the external signal SLEEP and the operation voltage VDDR. In one embodiment, the voltage monitor circuit 112 first determines whether the operation voltage VDDR reaches the first expected voltage. After the operation voltage VDDR reaches the first expected voltage, the voltage monitor circuit 112 determines whether the level of the external signal SLEEP is equal to the specific level. In another embodiment, the voltage monitor circuit 112 first determines whether the level of the external signal SLEEP is equal to the specific level. In this case, when the level of the external signal SLEEP is equal to the specific level, the voltage monitor circuit 112 starts determine whether the operation voltage VDDR reaches the first expected voltage. In other embodiments, the voltage monitor circuit 112 may directly receive the external signal SLEEP to determine whether the level of the external signal SLEEP is equal to the specific level. In another embodiment, the voltage monitor circuit 112 delays the external signal SLEEP and then determines whether the level of the delayed signal is equal to the specific level.

The micro-controller circuit 120 receives the operation voltage VDDR and the wake-up signal WKU. When the operation voltage VDDR is less than the first expected voltage, the micro-controller circuit 120 enters a sleep mode. In the sleep mode, since the operation voltage VDDR is not enough to drive the micro-controller circuit 120, the micro-controller circuit 120 stops operating. When the wake-up signal WKU is enabled, the micro-controller circuit 120 exits the sleep mode and enters a normal mode. In the normal mode, the operation voltage VDDR reaches the first expected voltage (or more than the first expected voltage), the micro-controller circuit 120 is driven to perform the corresponding operations.

The kind of micro-controller circuit 120 is not limited in the present disclosure. In one embodiment, the micro-controller circuit 120 may be a micro-processor. In another embodiment, the micro-controller circuit 120 is another control circuit which is similar to the control circuit 110. In this case, when the wake-up signal WKU is enabled, the micro-controller circuit 120 determines whether another operation voltage VDDQ reaches a second expected voltage. When the operation voltage VDDQ reaches the second expected voltage, the micro-controller circuit 120 enables another wake-up signal (not shown). In such cases, the wake-up signal which is enabled by the micro-controller circuit 120 may be used to wake-up another control circuit such that another control circuit determines whether another operation voltage different from VDDR and VDDQ reaches a corresponding expected voltage. In other embodiments, the wake-up signal enabled by the micro-controller circuit 120 may be used to wake-up a load circuit, such as a micro-controller unit (MCU).

Figure 2:
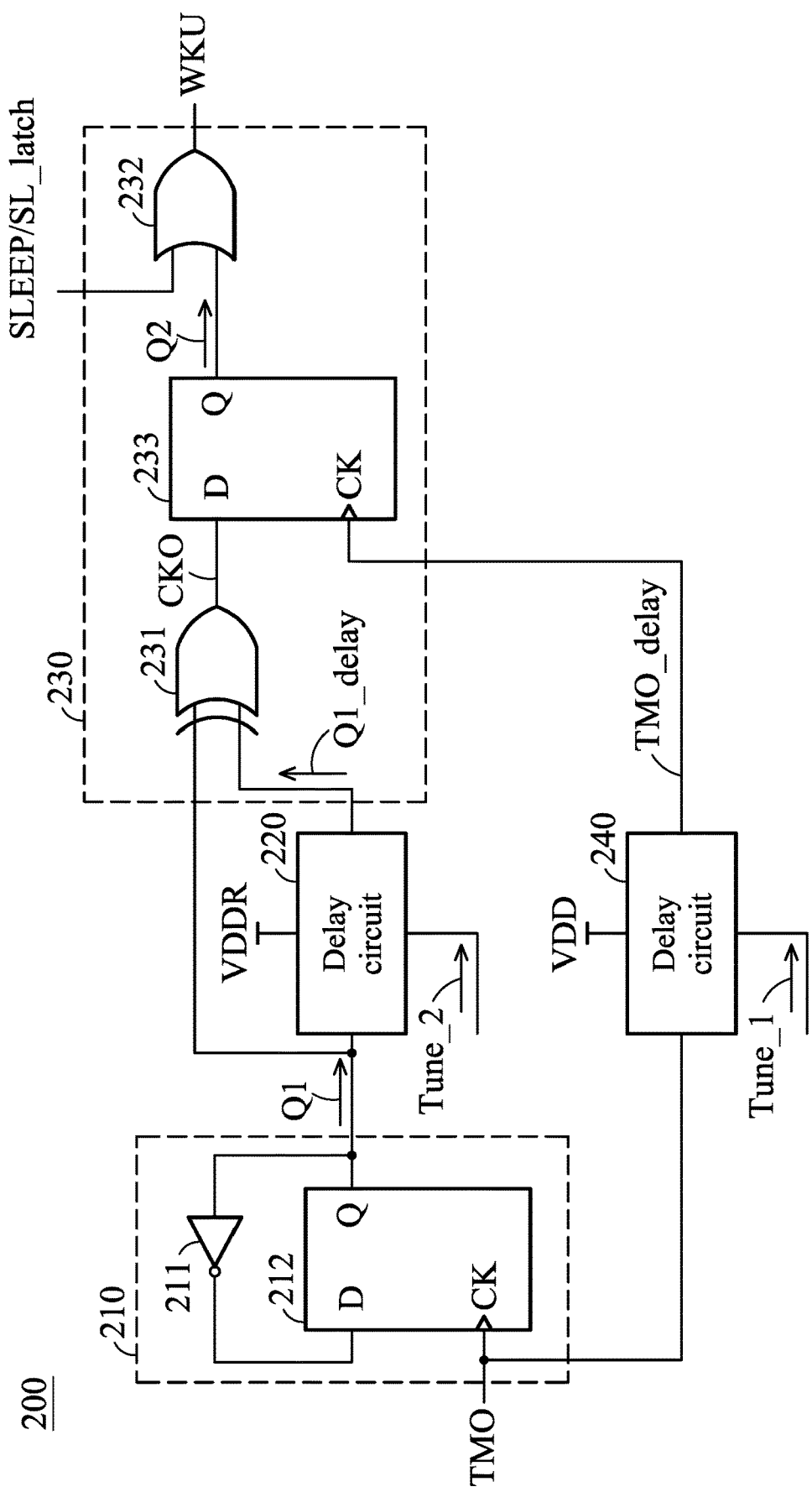
FIG. 2 is a schematic diagram of an exemplary embodiment of a voltage monitor circuit according to various aspects of the present disclosure.

FIG. 2 is a schematic diagram of an exemplary embodiment of the voltage monitor circuit according to various aspects of the present disclosure. The voltage monitor circuit 200 comprises a signal-generating circuit 210, delay circuits 220 and 240, and a determination circuit 230. The signal-generating circuit 210 generate a reference signal Q1 according to the trigger signal TMO. In this embodiment, the signal-generating circuit 210 comprises an inverter 211 and a D-type flip-flop 212. The inverter 211 is coupled between the input terminal D and the output terminal Q of the D-type flip-flop 212. In this case, the inverter 211 inverts the reference signal Q1 and provides the inverted signal to the input terminal D of the D-type flip-flop 212. The clock terminal CK of the D-type flip-flop 212 receives the trigger signal TMO. When the trigger signal TMO is enabled, the D-type flip-flop 212 transmits the signal of the input terminal D to the output terminal Q. In one embodiment, when the trigger signal TMO is enabled, the level of the trigger signal TMO is changed from a low level to a high level. In another embodiment, when the trigger signal TMO is enabled, the level of the trigger signal TMO is changed from a high level to a low level. In other embodiments, the initial level of the reference signal Q1 is a low level.

The delay circuit 220 receives the operation voltage VDDR and delays the reference signal Q1 to generate a delay signal Q1_delay. In this embodiment, with decrease of the operation voltage VDDR, the delay circuit 220 has a longer response time. Therefore, the delay circuit 220 takes more time to generate the delay signal Q1_delay. However, with increase of the operation voltage VDDR, the response time of the delay circuit 220 is decreased. When the operation voltage VDDR reaches or exceeds the expected voltage, the delay time between the reference signal Q1 and the delay signal Q1_delay is maintained at a fixed value. The delay time between the reference signal Q1 and the delay signal Q1_delay is referred to as first delay time.

In other embodiments, the delay circuit 220 adjusts the first delay time according to an adjustment signal Tune_2. In this case, the delay circuit 220 may comprise ten stages of delay elements. The designer of the voltage monitor circuit 200 uses the adjustment signal Tune_2 to trigger the first to fourth stages of delay elements of the delay circuit 220. At this time, the amount of delay time of the first to fourth states of the delay elements serves as the first delay time.

The delay circuit 240 delays the trigger signal TMO to generate a delay signal TMO_delay. In this embodiment, the delay circuit 240 receives the operation voltage VDD. In this case, even if the operation voltage VDDR is decreased and equal to a standby voltage, the operation voltage VDD is maintained at a fixed value. For example, when the micro-controller circuit 120 of FIG. 1 enters a sleep mode, the operation voltage VDDR is decreased to a standby voltage, such as 0V. In this case, the operation voltage VDD is maintained at a fixed value, such as 1.8V. When the micro-controller circuit 120 exits the sleep mode and enters a normal mode, the operation voltage VDDR is increase gradually. At this time, the operation voltage VDD is still maintained at the fixed value. In other words, no matter whether the micro-controller circuit 120 operates in the sleep mode or the normal mode, the operation voltage VDD remains unchanged, for example, at 1.8V.

In other embodiments, the delay circuit 240 adjusts the delay time between the trigger signal TMO and the delay signal TMO_delay according to an adjustment signal Tune_1. The delay time between the trigger signal TMO and the delay signal TMO_delay is referred to as second delay time. In such cases, the delay circuit 240 may comprise ten stages of delay elements. The designer of the voltage monitor circuit uses the adjustment signal Tune_1 to trigger the first to fifth stages of delay elements of the delay circuit 240. At this time, the amount of delay time of the first to fifth states of the delay elements serves as the second delay time. The second delay time may be the same as or different from the first delay time.

The determination circuit 230 determines whether the level of the reference signal Q1 is equal to the level of the delay signal Q1_delay according to the delay signal TMO_delay. For example, when the level of the delay signal TMO_delay is switched from a first level to a second level, the determination circuit 230 determines whether the level of the reference signal Q1 is equal to the level of the delay signal Q1_delay. The case in which the level of the reference signal Q1 is equal to the level of the delay signal Q1_delay indicates that the operation voltage VDDR is increased from a standby voltage (e.g., 0V) to the expected voltage. Therefore, the determination circuit 230 enables the wake-up signal WKU according to the level of the external signal SLEEP or the level of the delay signal SL_latch. In this embodiment, the determination circuit 230 comprises logic circuits 231 and 232, and a D-type flip-flop 233.

The logic circuit 231 receives the reference signal Q1 and the delay signal Q1_delay to generate an output signal CKO. In this embodiment, when the level of the reference signal Q1 is equal to the level of the delay signal Q1_delay, the level of the output signal CKO is equal to a first level. When the level of the reference signal Q1 is not equal to the level of the delay signal Q1_delay, the level of the output signal CKO is equal to a second level. The second level is opposite to the first level. For example, when the first level is a low level, the second level is a high level. When the first level is a high level, the second level is a low level. The structure of logic circuit 231 is not limited in the present disclosure. In this embodiment, the logic circuit 231 is a XOR gate.

The input terminal D of the D-type flip-flop 233 receives the output signal CKO. The clock terminal CK of the D-type flip-flop 233 receives the delay signal TMO_delay. The output terminal Q of the D-type flip-flop 233 provides a determination signal Q2. In this embodiment, when the level of the delay signal TMO_delay is changed from a first level to a second level, the D-type flip-flop 233 serves the output signal CKO as the determination signal Q2. In one embodiment, the case in which the level of the determination signal Q2 is equal to the first level (e.g., a low level) indicates that the level of the reference signal Q1 is equal to the level of the delay signal Q1_delay. The case in which the level of the determination signal Q2 is equal to the second level (e.g., a high level) indicates that the level of the reference signal Q1 is not equal to the level of the delay signal Q1_delay.

The logic circuit 232 is coupled to the output terminal Q of the D-type flip-flop 233 to receive the determination signal Q2. In this embodiment, the logic circuit 232 determines whether to enable the wake-up signal WKU according to the levels of the determination signal Q2 and the external signal SLEEP. For example, the case in which the level of the external signal SLEEP is equal to a specific level (e.g., a low level) indicates that a wake-up event occurs. At this time, if the level of the determination signal Q2 is equal to a first level (e.g., a low level), the logic circuit 232 enables the wake-up signal WKU. However, when the level of the determination signal Q2 is equal to a second level (e.g., a high level), even if a wake-up event occurs, the logic circuit 232 does not enable the wake-up signal WKU.

In another embodiment, the case in which the level of the external signal SLEEP is not equal to the specific level indicates that no wake-up event occurs. Therefore, the logic circuit 232 does not enable the wake-up signal WKU. At this time, even if the level of the determination signal Q2 is equal to the first level, the logic circuit 232 does not enable the wake-up signal WKU. The structure of the logic circuit 232 is not limited in the present disclosure. In one embodiment, the logic circuit 232 is an OR gate.

In other embodiments, the logic circuit 232 determines whether to enable the wake-up signal WKU according to the levels of the determination signal Q2 and the delay signal SL_latch. In this case, the delay signal SL_latch is obtained by delaying the external signal SLEEP. The delay signal SL_latch may be generated by an external device, such as the timer circuit 111. In some embodiments, the voltage monitor circuit 200 further comprises a delay circuit (not shown). The delay circuit receives and delays the external signal SLEEP to generate the delay signal SL_latch.

The case in which the level of the delay signal SL_latch is equal to a specific level indicates that a wake-up event occurs. At this time, if the level of the determination signal Q2 is equal to a first level (e.g., a low level), the logic circuit 232 enables the wake-up signal WKU. However, when the level of the determination signal Q2 is equal to a second level (e.g., a high level), even if a wake-up event occurs, the logic circuit 232 does not enable the wake-up signal WKU. In another embodiment, the case in which the level of the delay signal SL_latch is not equal to the specific level indicates that no wake-up event occurs. Therefore, the logic circuit 232 does not enable the wake-up signal WKU. At this time, even if the level of the determination signal Q2 is equal to the first level, the logic circuit 232 does not enable the wake-up signal WKU.

Figure 3:
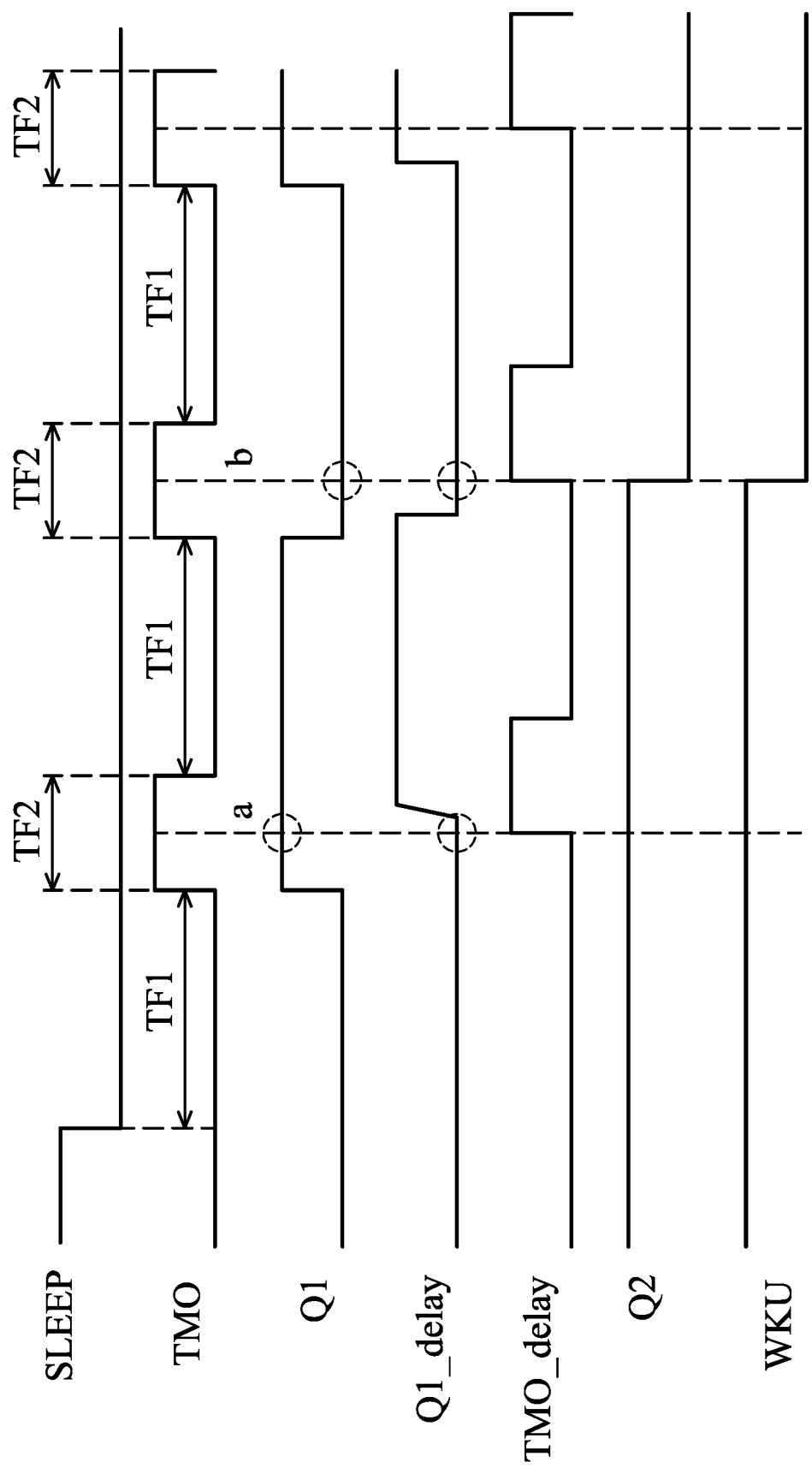
FIG. 3 is a signal schematic diagram of an exemplary embodiment of the voltage monitor circuit according to various aspects of the present disclosure.

FIG. 3 is a signal schematic diagram of an exemplary embodiment of the voltage monitor circuit of FIG. 2 according to various aspects of the present disclosure. When a wake-up event occurs, the level of the external signal SLEEP is changed. In one embodiment, the level of the external signal SLEEP is changed from a high level to a low level, but the disclosure is not limited thereto. In other embodiments, when a wake-up event occurs, the level of the external signal SLEEP is changed from a low level to a high level.

Since the level of the external signal SLEEP is equal to a specific level (e.g., a low level), the timer circuit 111 starts to perform a timer operation. In this embodiment, the timer circuit 111 enables the trigger signal TMO every the fixed time interval TF1. When the trigger signal TMO is enabled, the level of the trigger signal TMO is changed, such as from a low level to a high level. The trigger signal TMO may be maintained at the high level in the fixed time interval TF2. After the fixed time intervals TF2, the level of the trigger signal TMO reverts to the low level from the high level. Then, the timer circuit 111 re-performs the timer operation.

When the trigger signal TMO is enabled, the level of the reference signal Q1 is changed. In this embodiment, the initial level of the reference signal Q1 is a low level. Therefore, when the trigger signal TMO is enabled, the level of the reference signal Q1 is changed from the low level to a high level and maintained at the high level until the trigger signal TMO is re-enabled. In other embodiments, if the initial level of the reference signal Q1 is a high level, when the trigger signal TMO is enabled, the level of the reference signal Q1 is changed from the high level to a low level.

Since the delay circuit 220 delays the reference signal Q1, the delay signal Q1_delay lags the reference signal Q1. In this embodiment, since the delay circuit 220 receives the operation voltage VDDR, when the operation voltage VDDR is increased gradually, the delay time between the delay signal Q1_delay and the reference signal Q1 is reduced. When the operation voltage VDDR reaches the expected voltage, the delay time between the delay signal Q1_delay and the reference signal Q1 is maintained in a fixed value.

Additionally, since the delay circuit 240 delays the trigger signal TMO, the delay signal TMO_delay lags the trigger signal TMO. At the time point a, since the level of the delay signal TMO_delay is changed from a low level to a high level, the determination circuit 230 determines whether the level of the reference signal Q1 is equal to the level of the delay signal Q1_delay. At this time, since the level of the reference signal Q1 is not equal to the level of the delay signal Q1_delay, the level of the determination signal Q2 is remained. In this embodiment, the determination signal Q2 is remained at a high level.

At the time point b, since the level of the delay signal TMO_delay is re-changed from the low level to the high level, the determination circuit 230 re-determines whether the level of the reference signal Q1 is equal to the level of the delay signal Q1_delay. At this time, since the level of the reference signal Q1 is equal to the level of the delay signal Q1_delay, it is determined that the operation voltage VDDR reaches the expected voltage. Therefore, the level of the determination signal Q2 is changed. At this time, the wake-up signal WKU is enabled.

The level of the enabled wake-up signal WKU is not limited in the present disclosure. In one embodiment, when the wake-up signal WKU is enabled, the level of the wake-up signal WKU is also equal to the specific level, such as a low level. In this embodiment, the delay time between the wake-up signal WKU and the external signal SLEEP depends on the time for the operation voltage VDDR to reach the expected voltage. For example, with increase of the time for the operation voltage VDDR to reach the expected voltage, the delay time between the wake-up signal WKU and the external signal SLEEP is increased.

Figure 4A:
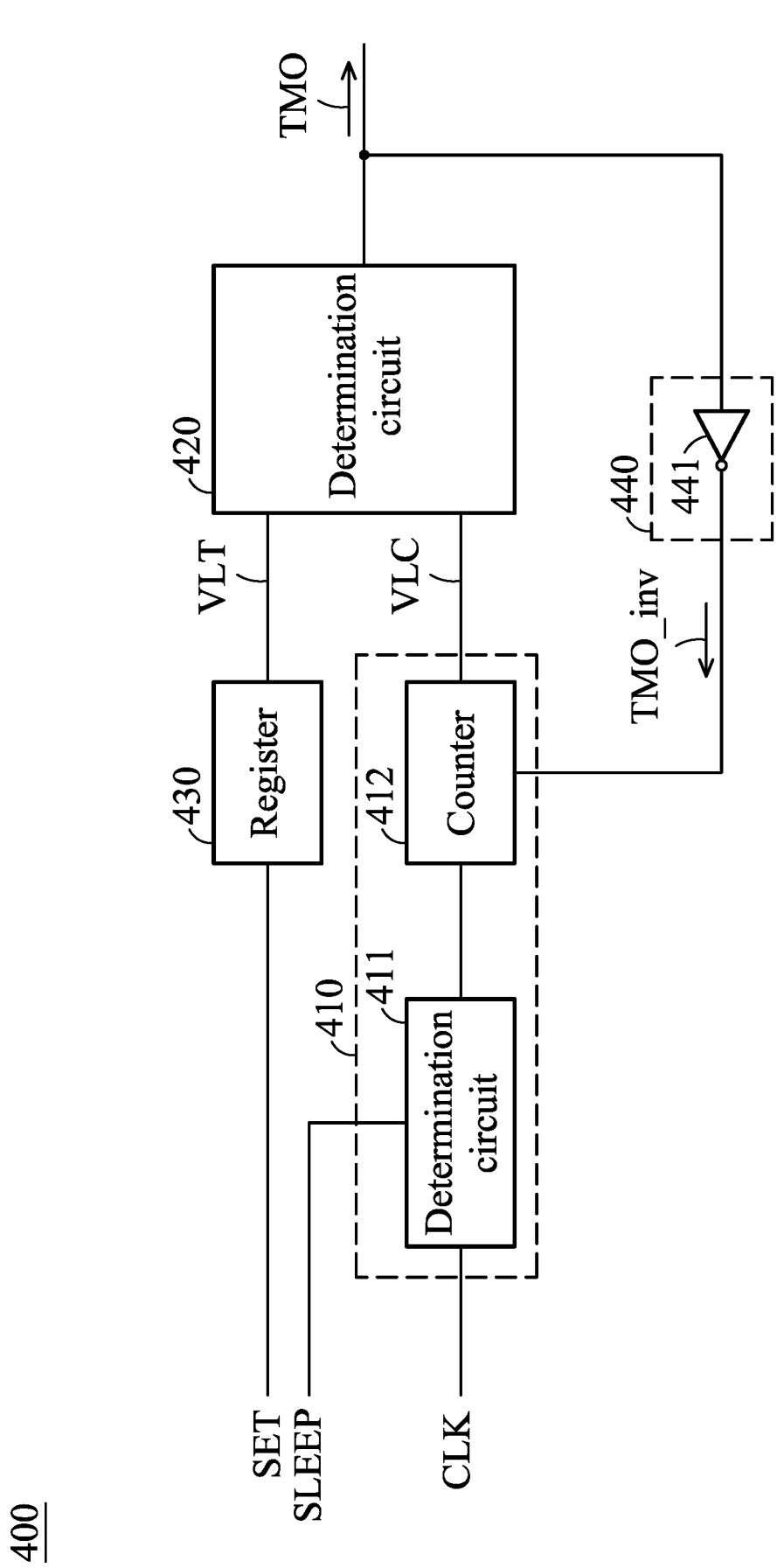
FIG. 4A is a schematic diagram of an exemplary embodiment of a timer circuit according to various aspects of the present disclosure.

FIG. 4A is a schematic diagram of an exemplary embodiment of the timer circuit according to various aspects of the present disclosure. The timer circuit 400 comprises a counter circuit 410, a determination circuit 420, and a reset circuit 440. The counter circuit 410 determines whether a wake-up event occurs according to the level of the external signal SLEEP. In this embodiment, the counter circuit 410 comprises a determination circuit 411 and a counter 412. The determination circuit 411 receives a clock signal CLK and determines whether to provide the clock signal CLK to the counter 412 according to the external signal SLEEP. For example, when the level of the external signal SLEEP is equal to a specific level, it is determined that a wake-up event occurs. Therefore, the determination circuit 411 outputs the clock signal CLK to the counter 412. However, when the level of the external signal SLEEP is not equal to the specific level, it is determined that no wake-up event occurs. Therefore, the determination circuit 411 does not output the clock signal CLK to the counter 412.

The counter 412 performs a counter operation according to the clock signal CLK to adjust a counting value VLC. The kind of counter 412 is not limited in the present disclosure. In one embodiment, the counter 412 is an up-counter. In another embodiment, the counter 412 is a down-counter.

The determination circuit 420 determines whether the counting value VLC reaches a target value VLT. When the counting value VLC reaches the target value VLT, it is determined that the duration during which the counter 412 performs the counter operation reaches a predetermined value, such as the fixed time interval TF1 of FIG. 3. Therefore, the determination circuit 420 enables the trigger signal TMO. When the counting value VLC does not reach the target value VLT, it is determined that the duration during which the counter 412 performs the counter operation does not reach the predetermined value. Therefore, the determination circuit 420 does not enable the trigger signal TMO. In one embodiment, the timer circuit 400 further comprises a register 430 to store the target value VLT. The register 430 sets the target value VLT according to a setting signal SET. The determination circuit 420 accesses the register 430 and the counter 412 to obtain the target value VLT and the counting value VLC.

The reset circuit 440 resets the counter 412 according to the trigger signal TMO such that the counting value regains to an initial value. In this embodiment, the case in which the determination circuit 420 enables the trigger signal TMO indicates that the duration during which the counter 412 performs the counter operation reaches a fixed value. Therefore, the reset circuit 440 resets the counter 412. The structure of reset circuit 440 is not limited in the present disclosure. In one embodiment, the reset circuit 440 comprises a logic circuit 441. The logic circuit 441 inverts the trigger signal TMO to generate an inverted signal TMO_inv. The structure of the logic circuit 441 is not limited in the present disclosure. The logic circuit 441 may be a NOT gate.

Figure 4B:
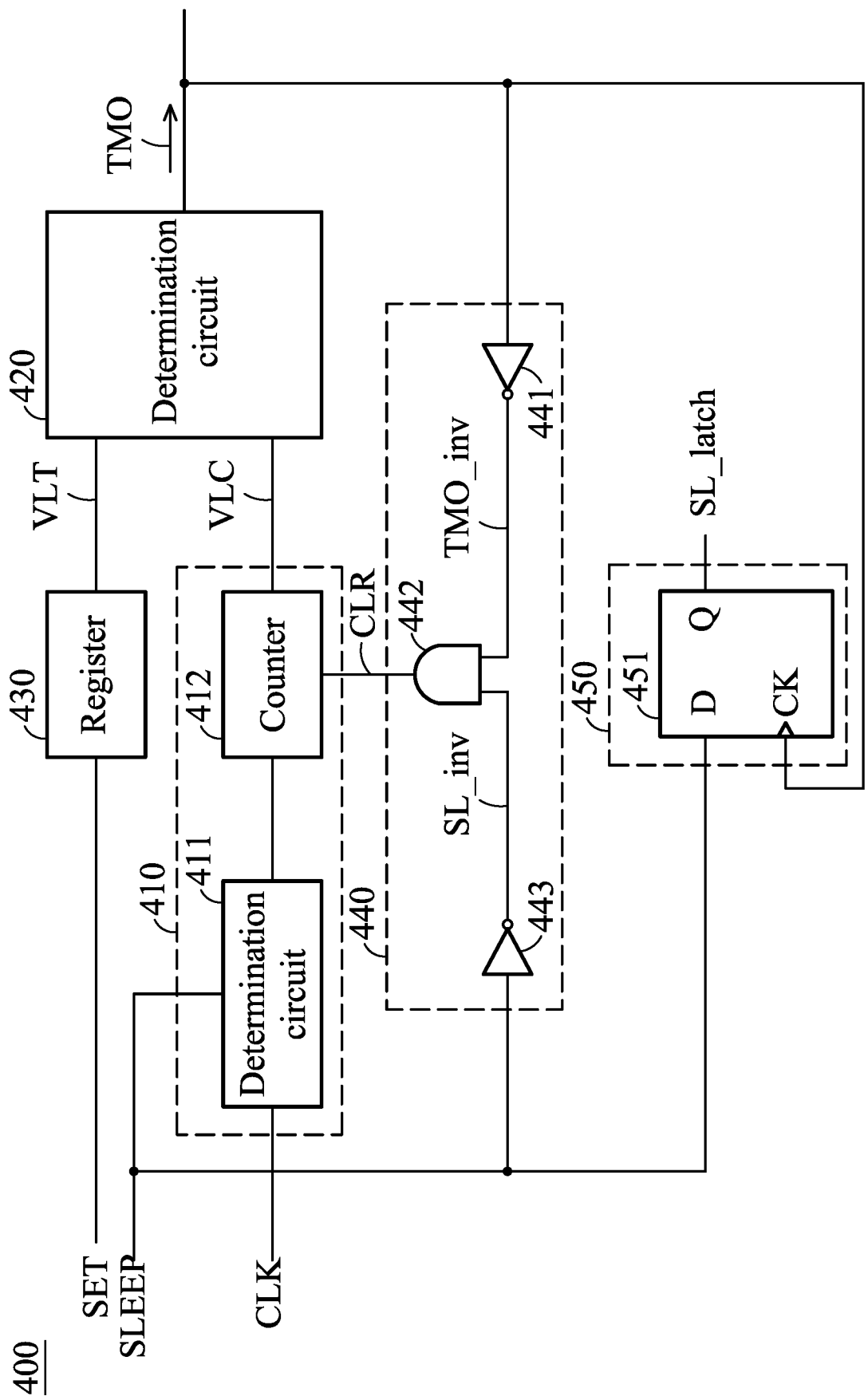
FIG. 4B is a schematic diagram of another exemplary embodiment of the timer circuit according to various aspects of the present disclosure.

FIG. 4B is a schematic diagram of another exemplary embodiment of the timer circuit according to various aspects of the present disclosure. FIG. 4B is similar to FIG. 4A except for the addition of delay circuit 450. The delay circuit 450 is coupled to the determination circuit 420. When the trigger signal TMO is enabled, the delay circuit 450 delays the external signal SLEEP to generate the delay signal SL_latch (or referred to as a latch signal). The structure of delay circuit 450 is not limited in the present disclosure. In one embodiment, the delay circuit 450 is a D-type flip-flop 451. The input terminal D of the 451 receives the external signal SLEEP. The clock terminal CK of the D-type flip-flop 451 receives the trigger signal TMO. The output terminal Q of the D-type flip-flop 451 provides the delay signal SL_latch.

Additionally, the reset circuit 440 of FIG. 4B further comprises logic circuits 442 and 443. The logic circuit 443 inverts the external signal SLEEP to generate an inverted signal SL_inv. In one embodiment, the logic circuit 443 is a NOT gate. The logic circuit 442 enables a reset signal CLR according to the inverted signals SL_inv and TMO_inv. For example, when the level of one of the inverted signals SL_inv and TMO_inv is equal to a specific level, the logic circuit 442 enables the reset signal CLR to reset the counter 412. When the level of each of the inverted signals SL_inv and TMO_inv is not equal to the specific level, the logic circuit 442 does not enable the reset signal CLR. In one embodiment, the logic circuit 442 is a AND gate.

Figure 5:
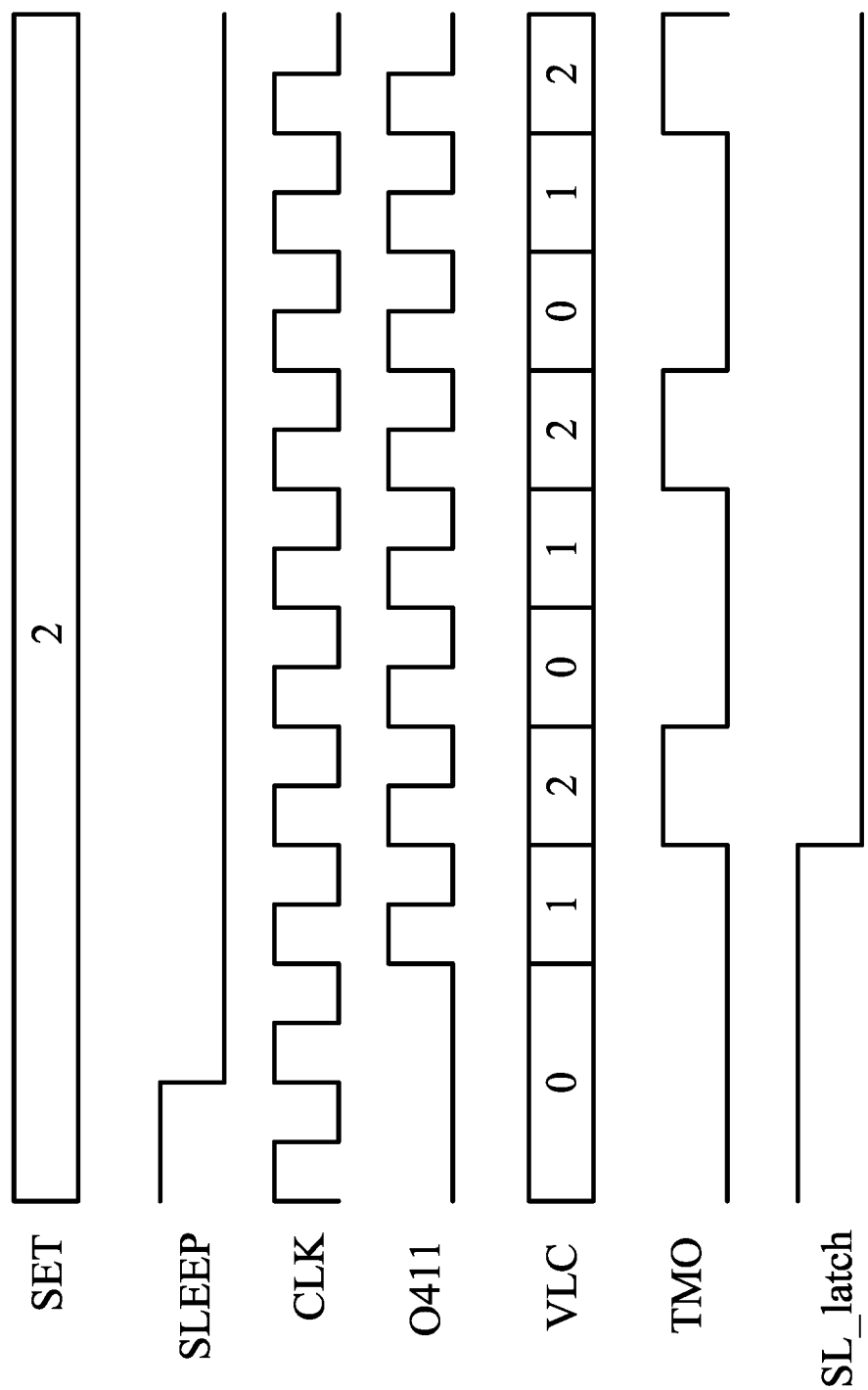
FIG. 5 is a signal schematic diagram of an exemplary embodiment of the timer circuit of FIG. 4B according to various aspects of the present disclosure.

FIG. 5 is a signal schematic diagram of an exemplary embodiment of the timer circuit of FIG. 4B according to various aspects of the present disclosure. In one embodiment, when the register 430 receives the setting signal SET, the register 430 stores a value, such as 2. In this case, the target value VLT is equal to 2. When the level of the external signal SLEEP is not equal to a specific level (e.g., a low level), the determination circuit 411 does not output the clock signal CLK to the counter 412. Therefore, the output signal O411 of the determination circuit 411 does not be changed. The output signal O411 may be maintained at a low level.

When the level of the external signal SLEEP is equal to a specific level, it is determined that a wake-up event occurs. Therefore, the determination circuit 411 outputs the clock signal CLK to the counter 412. At this time, the output signal O411 of the determination circuit 411 is the same as the clock signal CLK. After receiving the clock signal CLK, the counter 412 starts to perform a counter operation and adjusts the counting value VLC. When the counting value VLC is equal to 2, the trigger signal TMO is enabled and the reset circuit 440 resets the counting value VLC. Therefore, the counting value regains to an initial value, such as 0. Furthermore, when the trigger signal TMO is enabled, the delay circuit 450 sets the level of the delay signal SL_latch equal to the level of the external signal SLEEP, such as a low level.

The counter circuit 400 enables the trigger signal TMO every a fixed time interval. The duration of the fixed time interval is equal to the duration for which the counting value VLC of the counter 412 is increased from 0 to 2. Therefore, the subsequent voltage monitor circuit can determine whether the operation voltage VDDR reaches the expected voltage after the trigger signal TMO is enabled. When the operation voltage VDDR reaches the expected voltage, the voltage monitor circuit enables a wake-up signal WKU to wake-up subsequent circuits which receive the wake-up signal WKU. When the subsequent circuits operate according to the operation voltage VDDR, since the operation voltage VDDR has reached the expected voltage, the subsequent circuits are ensured to operate normally Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control circuit comprising:
a timer circuit, which enables a trigger signal every a fixed time interval in response to a wake-up event; and
a voltage monitor circuit configured to determine whether an operation voltage reaches an expected voltage and comprising:
a signal-generating circuit generating a reference signal according to the trigger signal;
a first delay circuit receiving the operation voltage and delaying the reference signal to generate a first delay signal;
a second delay circuit delaying the trigger signal to generate a second delay signal; and
a first determination circuit, which enables a wake-up signal according to the reference signal, the first delay signal, and the second delay signal in response to the wake-up event.

2. The control circuit as claimed in claim 1, wherein the signal-generating circuit comprises:
a first D-type flip-flop comprising a first input terminal, a first clock terminal receiving the trigger signal, and a first output terminal; and
a first inverter coupled between the first input terminal and the first output terminal.

3. The control circuit as claimed in claim 1, wherein the first determination circuit comprises:
a first logic circuit receiving the reference signal and the first delay signal to generate an output signal, wherein in response to the level of the reference signal being equal to the level of the first delay signal, the output signal is at a first level, and in response to the level of the reference signal not being equal to the level of the first delay signal, the output signal is at a second level, which is opposite to the first level;
a second D-type flip-flop comprising a second input terminal receiving the output signal, a second clock terminal receiving the second delay signal, and a second output terminal; and
a second logic circuit coupled to the second output terminal of the second D-type flip-flop.

4. The control circuit as claimed in claim 3, wherein the first logic circuit is a XOR gate, and the second logic circuit is an OR gate.

5. The control circuit as claimed in claim 3, wherein in response to the level of the second delay signal being changed from the first level to the second level, the second D-type flip-flop provides the output signal to the second logic circuit.

6. The control circuit as claimed in claim 5, wherein:
in response to the wake-up event and the level of the output signal being at the first level, the second logic circuit enables the wake-up signal, and
in response to the wake-up event not occurring or the level of the output signal being at the second level, the second logic circuit does not enable the wake-up signal.

7. The control circuit as claimed in claim 6, wherein:
the reference signal is delayed by a first delay time to obtain the first delay signal,
the trigger signal is delayed by a second delay time to obtain the second delay signal, and
the first delay time is different from the second delay time.

8. The control circuit as claimed in claim 1, wherein the timer circuit comprises:
a counter circuit, which adjusts a counting value according to a clock signal in response to the wake-up event;
a second determination circuit determining whether the counting value reaches a target value, wherein in response to the counting value reaching the target value, the second determination circuit enables the trigger signal; and
a reset circuit, which resets the counting value in response to the second determination circuit enabling the trigger signal.

9. The control circuit as claimed in claim 8, wherein the counter circuit comprises:
a counter adjusting the counting value according to the clock signal; and
a third determination circuit determining whether the wake-up event occurs, wherein in response to the wake-up event, the third determination circuit provides the clock signal to the counter.

10. The control circuit as claimed in claim 9, further comprising:
a register configured to store the target value,
wherein the second determination circuit accesses the register and the counter to obtain the target value and the counting value.

11. The control circuit as claimed in claim 8, wherein the reset signal comprises:
a second inverter inverting the trigger signal to generate an inverted signal,
wherein the counter circuit resets the counting value according to the inverted signal.

12. The control circuit as claimed in claim 11, wherein the reset circuit further comprises:
an AND gate coupled to the second inverter,
wherein in response to no wake-up event, the AND gate resets the counting value, and in response to the wake-up event, the AND gate resets the counting value according to the inverted signal.

13. The control circuit as claimed in claim 12, wherein the reset circuit further comprises:
a third delay circuit, which generates a latch signal to the first determination circuit according to the trigger signal in response to the wake-up event,
wherein the first determination circuit determines that the wake-up event occurs according to the latch signal.

14. The control circuit as claimed in claim 13, wherein the third delay circuit comprises:
a third D-type flip-flop comprising a third input terminal, a third clock terminal, and a third output terminal, wherein:
the third input terminal receives an external signal, the third clock terminal receives the trigger signal, and the third output terminal provides the latch signal,
in response to the external signal being at a specific level, it is determined that the wake-up event occurs.

15. An operating system comprising:
a micro-controller circuit receiving a first operation voltage, wherein in response to the first operation voltage being less than an expected voltage, the micro-controller circuit enters a sleep mode, in response to a wake-up signal being enabled, the micro-controller circuit exits the sleep mode and enters a normal mode, and in the normal mode, the micro-controller circuit operates according to the first operation voltage; and
a control circuit, which determines whether the first operation voltage reaches the expected voltage in response to a wake-up event, wherein in response to the first operation voltage reaching the expected voltage, the control circuit enables the wake-up signal, and the control circuit comprises:
a timer circuit, which enables a trigger signal every a fixed time interval in response to the wake-up event; and
a voltage monitor circuit configured to determine whether the first operation voltage reaches the expected voltage, wherein in response to the first operation voltage reaching the expected voltage, the voltage monitor circuit enables the wake-up signal;
wherein the voltage monitor circuit comprises:
a signal-generating circuit generating a reference signal according to the trigger signal;
a first delay circuit receiving the first operation voltage and delaying the reference signal to generate a first delay signal;
a second delay circuit delaying the trigger signal to generate a second delay signal; and
a determination circuit, which enables the wake-up signal according to the reference signal, the first delay signal, and the second delay signal in response to the wake-up event.

16. The operating system as claimed in claim 15, wherein the signal-generating circuit comprises:
a first D-type flip-flop comprising a first input terminal, a first clock terminal receiving the trigger signal, and a first output terminal; and
a first inverter coupled between the first input terminal and the first output terminal.

17. The operating system as claimed in claim 16, wherein in response to the level of the second delay signal being changed, the determination circuit determines whether the level of the reference signal is equal to the level of the first delay signal.

18. The operating system as claimed in claim 17, wherein the determination circuit comprises:
a XOR gate receiving the reference signal and the first delay signal to generate an output signal, wherein in response to the level of the reference signal being equal to the level of the first delay signal, the output signal is at a first level, and in response to the level of the reference signal not being equal to the level of the first delay signal, the output signal is at a second level, which is opposite to the first level;
a second D-type flip-flop comprising a second input terminal receiving the output signal, a second clock terminal receiving the second delay signal, and a second output terminal; and
an OR gate coupled to the second output terminal, wherein in response to the wake-up event and the level of the output signal being at the first level, the OR gate enables the wake-up signal, and in response to the wake-up event not occurring or the level of the output signal being at the second level, the OR gate does not enable the wake-up signal.

19. The operating system as claimed in claim 17, wherein:
the second delay circuit receives a second operation voltage, in response to the micro-controller circuit entering the sleep mode, the second operation voltage is maintained at a fixed value and the first operation voltage is equal to a standby voltage, in response to the micro-controller circuit entering the normal mode, the second operation voltage is maintained at the fixed value and the first operation voltage is increased from the standby voltage.

\* \* \* \* \*